(12) United States Patent
Ramaswamy et al.

(10) Patent No.: US 7,538,392 B2
(45) Date of Patent: May 26, 2009

(54) PSEUDO SOI SUBSTRATE AND ASSOCIATED SEMICONDUCTOR DEVICES

(75) Inventors: Nirmal Ramaswamy, Boise, ID (US); Eric Blomiley, Boise, ID (US); Joel Drewes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/834,367

(22) Filed: Aug. 6, 2007

(65) Prior Publication Data

US 2008/0035998 A1 Feb. 14, 2008

Related U.S. Application Data

(63) Continuation of application No. 11/122,362, filed on May 5, 2005, now Pat. No. 7,268,023.

(51) Int. Cl.
*H01L 21/84* (2006.01)

(52) U.S. Cl. .............................. 257/347; 257/E21.561; 438/151

(58) Field of Classification Search ................. 438/407, 438/162, 151; 257/347, E21.561
See application file for complete search history.

(56) References Cited

U.S. PATENT DOCUMENTS

| | | | | |
|---|---|---|---|---|
| 4,683,637 A | * | 8/1987 | Varker et al. ................ 438/294 |
| 4,700,454 A | * | 10/1987 | Baerg et al. ................ 438/297 |
| 5,567,629 A | * | 10/1996 | Kubo ........................ 438/286 |
| 5,712,173 A | * | 1/1998 | Liu et al. ..................... 438/297 |
| 6,697,284 B2 | | 2/2004 | Marotta ................. 365/189.03 |
| 6,751,121 B2 | | 6/2004 | Marotta ................. 365/185.09 |
| 6,829,176 B2 | | 12/2004 | Callaway et al. ....... 365/189.01 |
| 6,850,452 B2 | | 2/2005 | Keeth et al. ................ 365/226 |
| 7,015,147 B2 | | 3/2006 | Lee et al. .................... 438/734 |

OTHER PUBLICATIONS

Sato et al., "Fabrication of Silicon-on-Nothing Structure by Substrate Engineering Using the Empty-Space-in-Silicon Formation Technique," *Japanese Journal of Applied Physics*, 43:12-18, 2004.
Yeo et al., "80 nm 512M DRAM with Enhanced Data Retention Time Using Partially-Insulated Cell Array Transistor (PiCAT)," *2004 Symposium on VLSI Technology Digest of Technical Papers*, pp. 30-31, 2004.

* cited by examiner

*Primary Examiner*—Richard A. Booth
(74) *Attorney, Agent, or Firm*—Wells St. John P.S.

(57) ABSTRACT

The present invention is generally directed to a method of forming a pseudo SOI substrate and semiconductor devices. In one illustrative embodiment, the method comprises forming a plurality of trenches in a semiconducting substrate comprised of silicon, each of the trenches having a depth, forming a layer of insulating material within each of the plurality of trenches, the layer of insulating material having a thickness that is less than the depth of the trenches, and performing an anneal process on the substrate in a hydrogen environment to cause the silicon substrate material to merge above the layer of insulating material within the plurality of trenches to thereby define a pseudo SOI substrate.

21 Claims, 7 Drawing Sheets

PSEUDO SOI SUBSTRATE AND ASSOCIATED SEMICONDUCTOR DEVICES

CROSS-REFERENCE TO RELATED APPLICATIONS

This is a continuation of U.S. patent application Ser. No. 11/122,362, filed May 5, 2005, now U.S. Pat. No. 7,268,023, which issued on Sep. 11, 2007.

BACKGROUND OF THE INVENTION

1. Field of the Invention

The present invention is generally related to the field of manufacturing integrated circuit devices, and, more particularly, to a method of forming a pseudo SOI substrate and integrated circuit devices thereabove.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate insulation thickness, and the like, are reduced. For example, all other things being equal, the smaller the channel length of the transistor, the faster the transistor will operate. Thus, there is a constant drive to reduce the size, or scale, of the components of a typical transistor to increase the overall speed of the transistor, as well as integrated circuit devices incorporating such transistors.

As transistors are continually scaled in keeping with the requirements of advancing technology, device reliability dictates an associated reduction in the power supply voltage. Hence, every successive technology generation is often accompanied by a reduction in the operating voltage of the transistor. It is known that transistor devices fabricated on silicon-on-insulator (SOI) substrates exhibit better performance at low operating voltages than do transistors of similar dimensions fabricated in bulk silicon substrates. The superior performance of SOI devices at low operating voltage is related to the relatively lower junction capacitances obtained on an SOI device as compared to a bulk silicon device of similar dimensions. The buried oxide layer in an SOI device separates active transistor regions from the bulk silicon substrate, thus reducing junction capacitance.

Transistors fabricated in SOI substrates offer several performance advantages over transistors fabricated in bulk silicon substrates. For example, complementary-metal-oxide-semiconductor (CMOS) devices fabricated in SOI substrates are less prone to disabling capacitive coupling, known as latch-up. In addition, transistors fabricated in SOI substrates, in general, have large drive currents and high transconductance values. Also, the sub-micron SOI transistors have improved immunity to short-channel effects when compared with bulk transistors fabricated to similar dimensions.

However, SOI substrates are expensive as compared to bulk silicon substrates and thus tend to increase the cost of manufacturing. Moreover, some of the techniques for forming SOI substrates, e.g., epitaxial growth of silicon on a previously formed oxide layer, can result in defects being present in the silicon layer where elements of the integrated circuit device will be formed.

The present invention is directed to a device and various methods that may solve, or at least reduce, some or all of the aforementioned problems.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present invention is generally directed to a method of forming a pseudo SOI substrate and semiconductor devices. In one illustrative embodiment, the method comprises forming a plurality of trenches in a semiconducting substrate comprised of silicon, each of the trenches having a depth, forming a layer of insulating material within each of the plurality of trenches, the layer of insulating material having a thickness that is less than the depth of the trenches, and performing an anneal process on the substrate in a hydrogen environment to cause the silicon substrate material to merge above the layer of insulating material within the plurality of trenches to thereby define a pseudo SOI substrate.

In another illustrative embodiment, the method comprises forming a plurality of trenches in a semiconducting substrate comprised of silicon, each of the trenches having a depth, forming a layer of insulating material within each of the plurality of trenches, the layer of insulating material having a thickness that is less than the depth of the trenches, and performing an anneal process on the substrate in a hydrogen environment to cause the silicon substrate material to merge above and encapsulate the layer of insulating material within the plurality of trenches to thereby define a pseudo SOI substrate.

In yet another illustrative embodiment, the method comprises forming a plurality of trenches in a semiconducting substrate comprised of silicon, each of the trenches having a depth, forming a layer of insulating material within each of the plurality of trenches, the layer of insulating material having a thickness that is less than the depth of the trenches, and performing an anneal process on the substrate in a hydrogen environment having a partial pressure of 1-200 Torr to cause the silicon substrate material to merge above the layer of insulating material within the plurality of trenches to thereby define a pseudo SOI substrate, wherein the anneal process is performed at a temperature ranging from approximately 800-1200° C.

BRIEF DESCRIPTION OF THE DRAWINGS

The invention may be understood by reference to the following description taken in conjunction with the accompanying drawings, in which like reference numerals identify like elements, and in which.

Figure 1A:
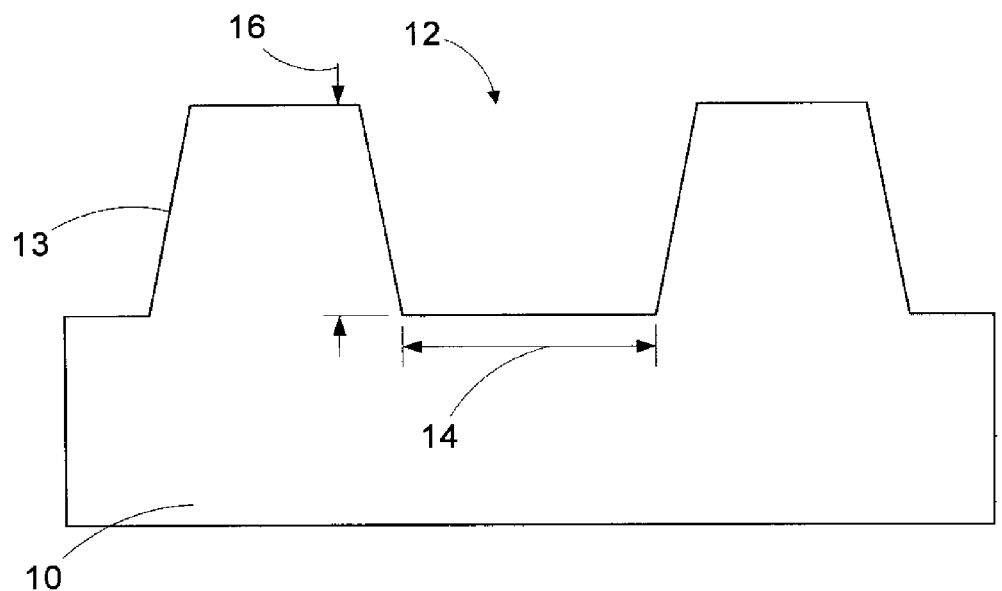
FIGS. 1A-1C are cross-sectional views depicting one illustrative process flow for forming a pseudo SOI substrate in accordance with the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 1B:
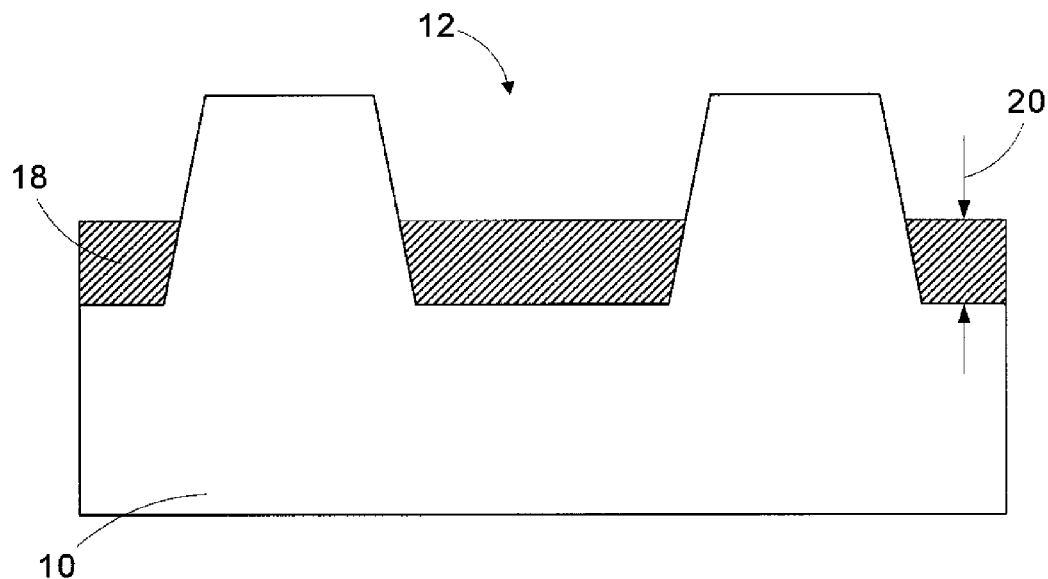
Figure 1C:
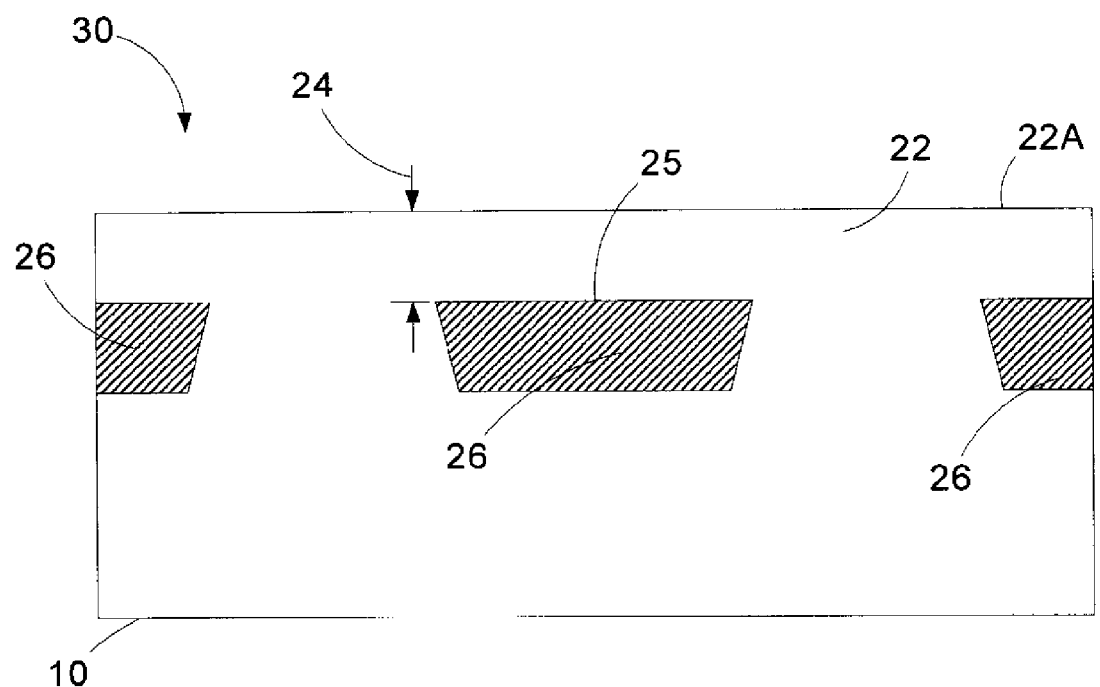

FIGS. 1A-1C depict one illustrative embodiment of a method of forming pseudo SOI substrates in accordance with the present invention. As will be recognized by those skilled in the art after a complete reading of the present application, the present invention has broad application and may be employed in manufacturing a variety of integrated circuit devices. Thus, the illustrative examples depicted herein should not be considered as limitations of the present invention.

FIG. 1A depicts an illustrative semiconducting substrate 10 which may be employed as the starting material in manufacturing the pseudo SOI substrate disclosed herein. The semiconducting substrate 10 may be comprised of a variety of semiconducting materials such as doped or undoped silicon. In one illustrative embodiment, the substrate 10 is a bulk silicon substrate doped with an appropriate dopant material, i.e., an N-type or P-type dopant, depending on the particular application.

Initially, as shown in FIG. 1A, a plurality of trenches 12 are formed in the substrate 10. The trenches 12 may be formed by performing known photolithography and etching processes, e.g., an anisotropic reactive ion etching process. The size and shape of the trenches 12 may vary depending upon the particular application. For example, the width 14 of the trenches 12 may vary from approximately 50-5000 nm, and the depth 16 may vary from approximately 500-5000 Å. The profile of the trenches 12, as defined by the sidewalls 13, may also vary. Moreover, the trenches 12 need not be formed over the entirety of the substrate 10, and the width and configuration of such trenches on a single substrate 10 may be varied if desired.

As shown in FIG. 1B, after the trenches 12 are formed, a layer of insulating material 18 is formed within the trenches 12. The thickness 20 of the layer of insulating material 18, as well as its composition, may vary depending upon the particular application. For example, the layer of insulating material 18 may be comprised of a variety of insulating materials, e.g., silicon dioxide, silicon nitride or silicon oxynitride, and it may have a thickness 20 ranging from approximately 200-3000 Å.

Figure 2A:
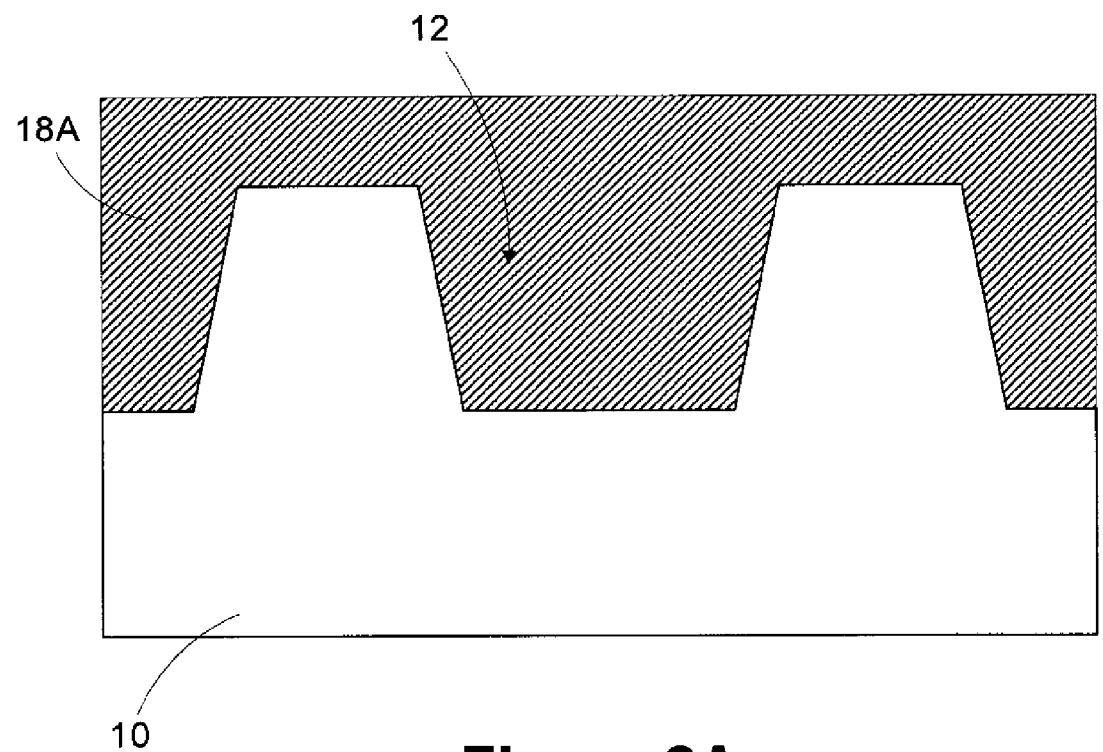
FIGS. 2A-2C depict an illustrative example of forming an insulating layer in accordance with the present invention.
Figure 2B:
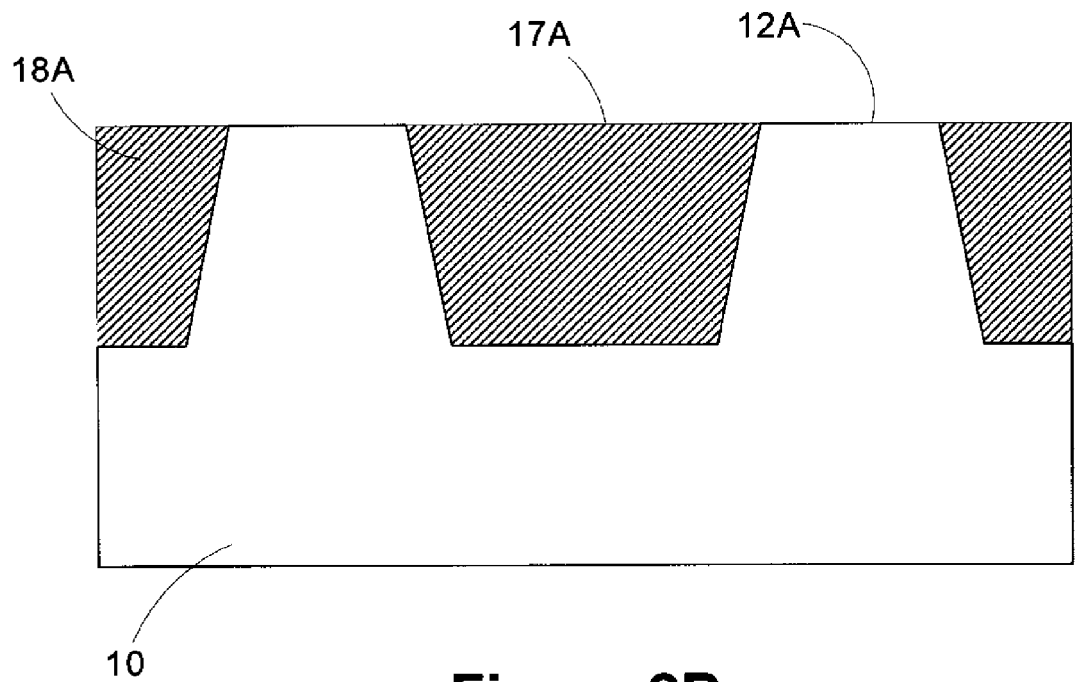
Figure 2C:
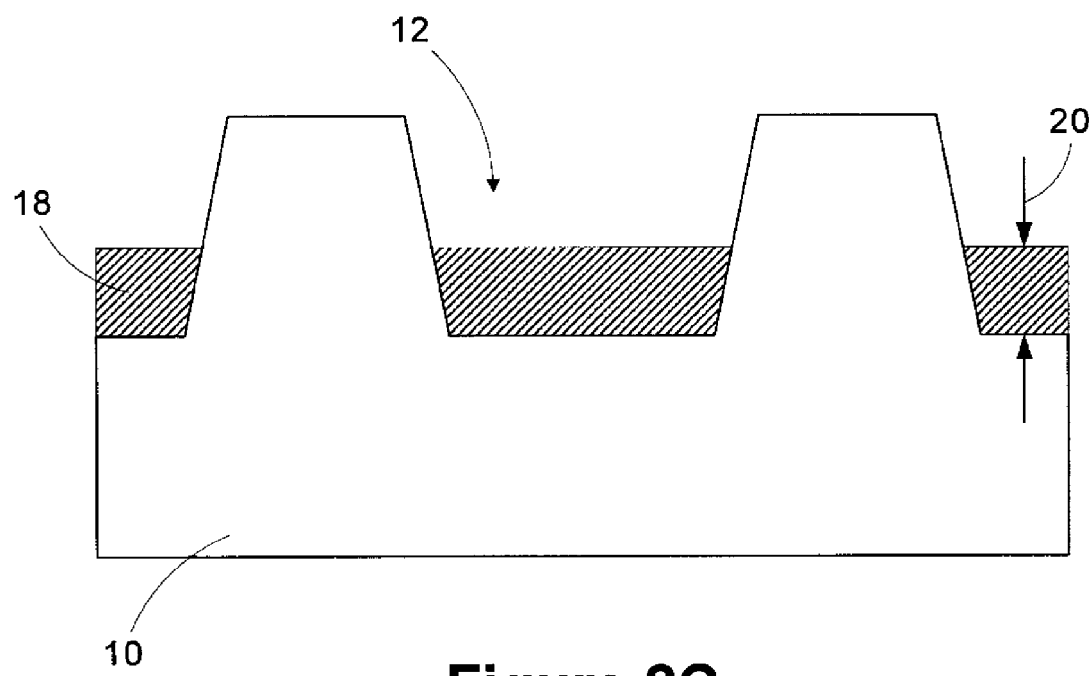

The layer of insulating material 18 may be formed by a variety of techniques. FIGS. 2A-2C depict an illustrative example of forming an insulating layer 18 comprised of silicon dioxide. As shown therein, a layer of silicon dioxide 18A is blanket-deposited across the substrate 10 and completely fills the trenches 12. The layer of silicon dioxide 18A may be formed by performing a variety of known deposition processes, e.g., a chemical vapor deposition process. As shown in FIG. 2B, a planarization step, such as, for example, a chemical mechanical polishing step, is performed to substantially planarize the surface 17A of the silicon dioxide layer 18A with the surface 12A of the trenches 12. Thereafter, as shown in FIG. 2C, a wet etching process may be performed to recess or reduce the thickness of the layer of insulating material 18A to the desired thickness 20 shown in FIG. 1B.

Figure 3A:
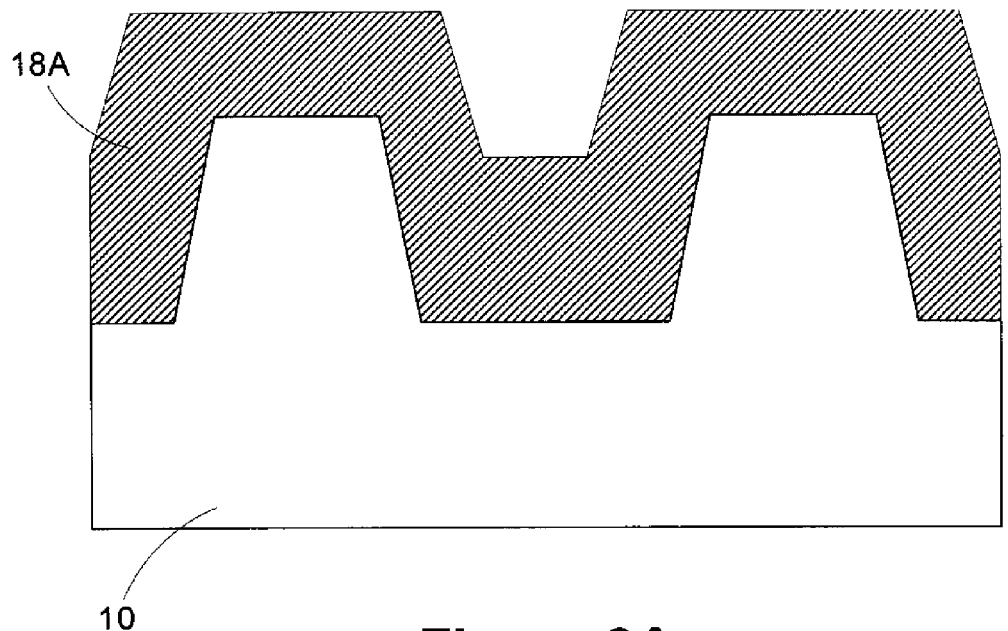
FIGS. 3A-3C depict yet another illustrative example of forming a layer of insulating material in accordance with one aspect of the present invention.
Figure 3B:
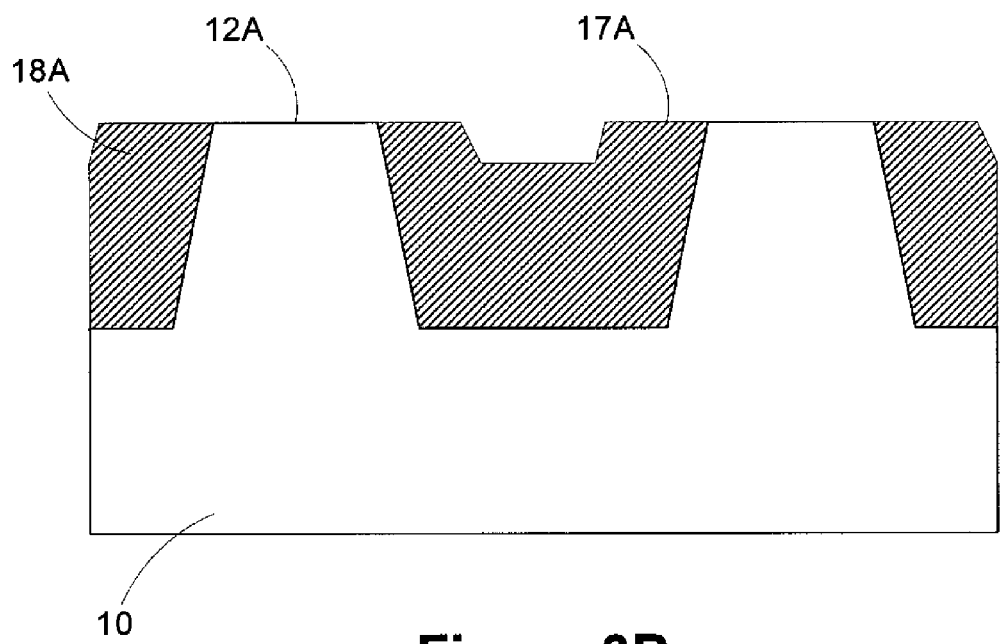
Figure 3C:
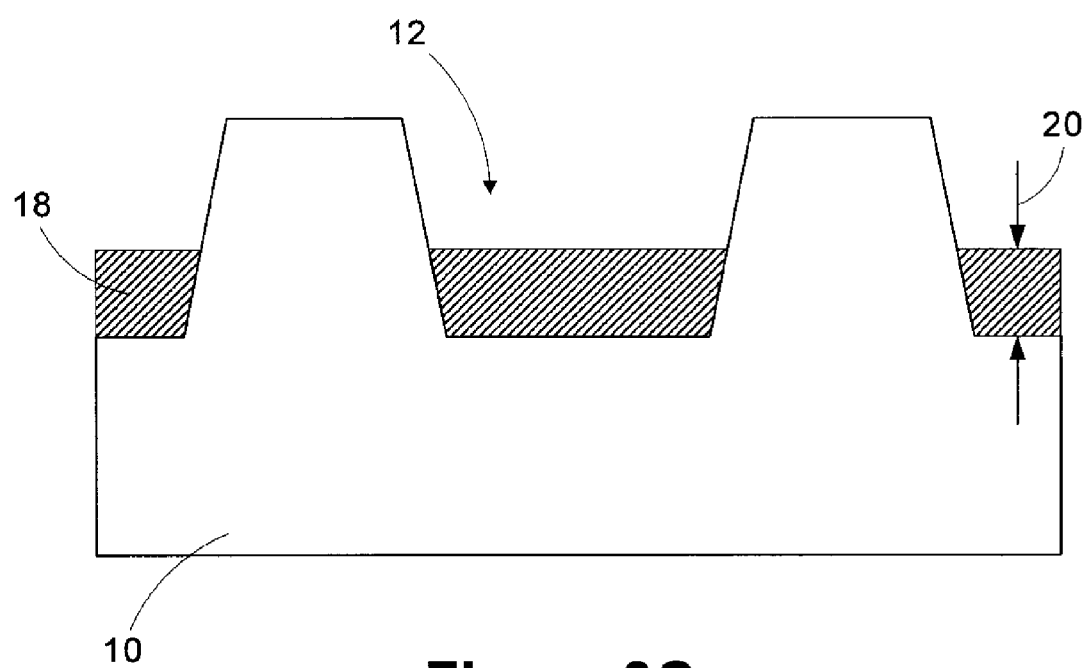

Alternatively, the layer of insulating material 18 could be a thermally grown layer of silicon dioxide, as depicted in FIGS. 3A-3C. As shown in FIG. 3A, the layer of silicon dioxide 18A is initially formed by performing a well known thermal growth process. Thereafter, as indicated in FIG. 3B, a planarization step is performed to eliminate the portions of the thermally grown silicon dioxide positioned above the surface 12A of the trenches 12. At that point, a wet etching process may be performed to reduce the thickness of the layer of silicon dioxide 18A to the final desired thickness 20 depicted in FIG. 3C. As yet another alternative, the layer of insulating material 18 may be comprised of a material, such as well known silicon oxide or silicon oxynitride precursors, that may be applied by a spin coating technique.

Next, the substrate 10 is subjected to an anneal process performed in a hydrogen ambient at a relatively high temperature. The anneal process increases the surface mobility of the silicon substrate 10 causing the portions of the substrate positioned above the insulating layer 18 to merge with adjacent silicon material to thereby result in the pseudo SOI structure 30 depicted in FIG. 1C. The pseudo SOI substrate 30 comprises a continuous region of silicon 22 positioned above the upper surfaces 25 of a plurality of regions 26 comprised of insulating material. In a sense, the anneal process causes the silicon material to merge above the insulating material 18 within the trenches 12 to thereby define the regions 26 of insulating material. The regions 26 of insulating material may be of any desired shape or configuration. For example, the regions 26 may take the shape of a line, a rectangular area, etc. In some applications, the trench 12 may be formed such that, after the anneal process is performed, the region 26 of insulating material is encapsulated by silicon. The thickness 24 of the layer of silicon 22 may vary depending upon the particular application. In one illustrative embodiment, the thickness 24 may range from approximately 100-1000 Å.

The hydrogen anneal process described above may be performed in a traditional furnace, in an RTA chamber or any other tool capable of performing the anneal process described herein. The temperature of the anneal process may vary depending upon the particular application. In general, the anneal process may be performed at a temperature ranging from approximately 800-1000° C. if the insulating material 18 is comprised of silicon dioxide or other like materials. If the insulating material 18 is comprised of a material that can withstand higher temperatures, e.g., silicon nitride, then the anneal process may be performed at a slightly higher temperature, e.g., 800-1200° C. The duration of the anneal process may also vary depending on the particular application. In one illustrative embodiment, the anneal process may be performed for a duration ranging from approximately 10 seconds (for an RTA anneal) to 2 minutes.

The partial pressure of hydrogen during the anneal process may range from approximately 1-200 Torr depending on the particular application. Performing the anneal process in the hydrogen environment increases the surface mobility of the silicon, thus allowing the portions of the silicon material to merge with one another as depicted in FIG. 1C. After the anneal process is performed, a planarization process, e.g., a chemical mechanical planarization process, may be performed on the surface 22A of the merged silicon material 22 if desired or needed.

The substantially continuous layer of silicon 22 has a relatively low occurrence of defects and, in some cases, may be substantially defect free as the silicon material is allowed to merge together during the anneal process described above. That is, the present invention is fundamentally different from an epitaxial silicon growth process wherein defects in the resulting layer of epitaxial silicon are known to exist.

Figure 4:
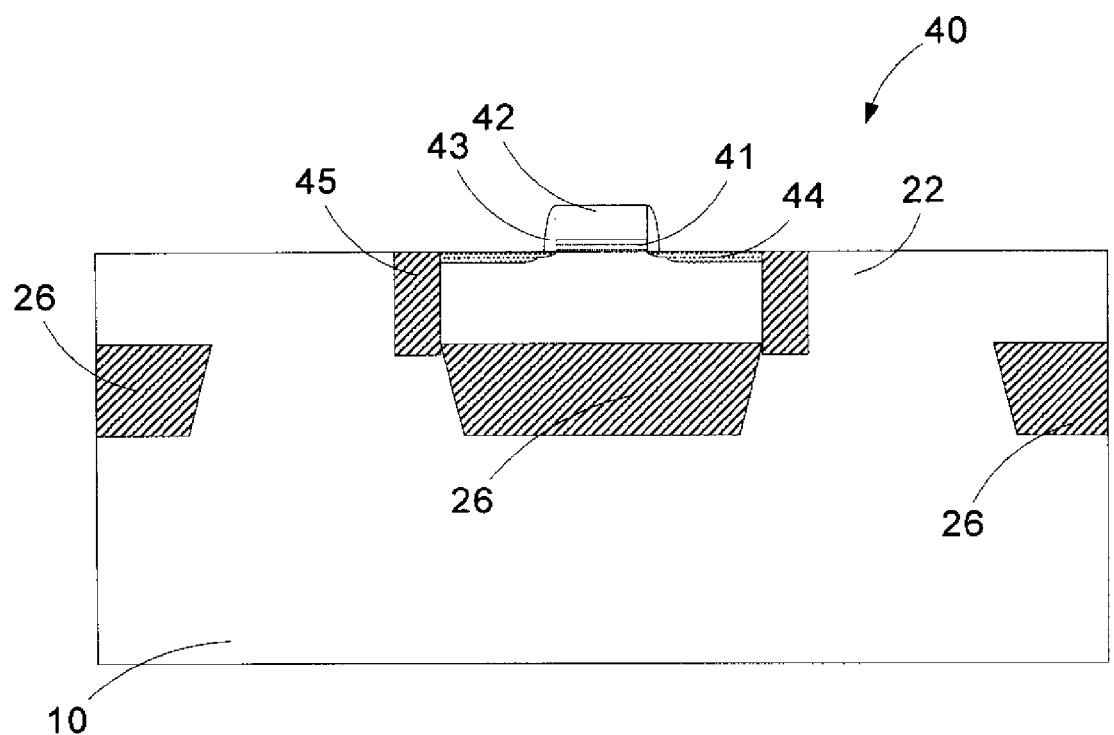
FIG. 4 depicts an illustrative transistor device formed above the pseudo SOI substrate depicted in FIG. 1C.

After the pseudo SOI substrate 30 depicted in FIG. 1C is formed, traditional processing operations may be performed to form any of a variety of different integrated circuit devices on and above the pseudo SOI substrate 30. For example, FIG. 4 depicts an illustrative transistor 40 formed above the pseudo SOI substrate 30. The transistor 40 is comprised of a variety of known components and it may be manufactured using a variety of known techniques. For example, the transistor 40 may comprise a gate insulation layer 41, a gate electrode 42, a sidewall spacer 43 and source/drain regions 44. A trench isolation region 45 may be formed in the layer of silicon material 22 to electrically isolate the transistor 40. Note that, in this illustrative example, the channel region of the transistor 40 is positioned above the region 26 of insulating material. The materials of construction of the various components of the transistor 40, as well as the manner in which such components are made, are well known to those skilled in the art and will not be described any further so as not to obscure the present invention. The illustrative transistor 40 may be part of a larger integrated circuit that is part of a semiconductor device, such as a memory chip, a logic chip and/or an application specific integrated circuit (ASIC).

Figure 5:
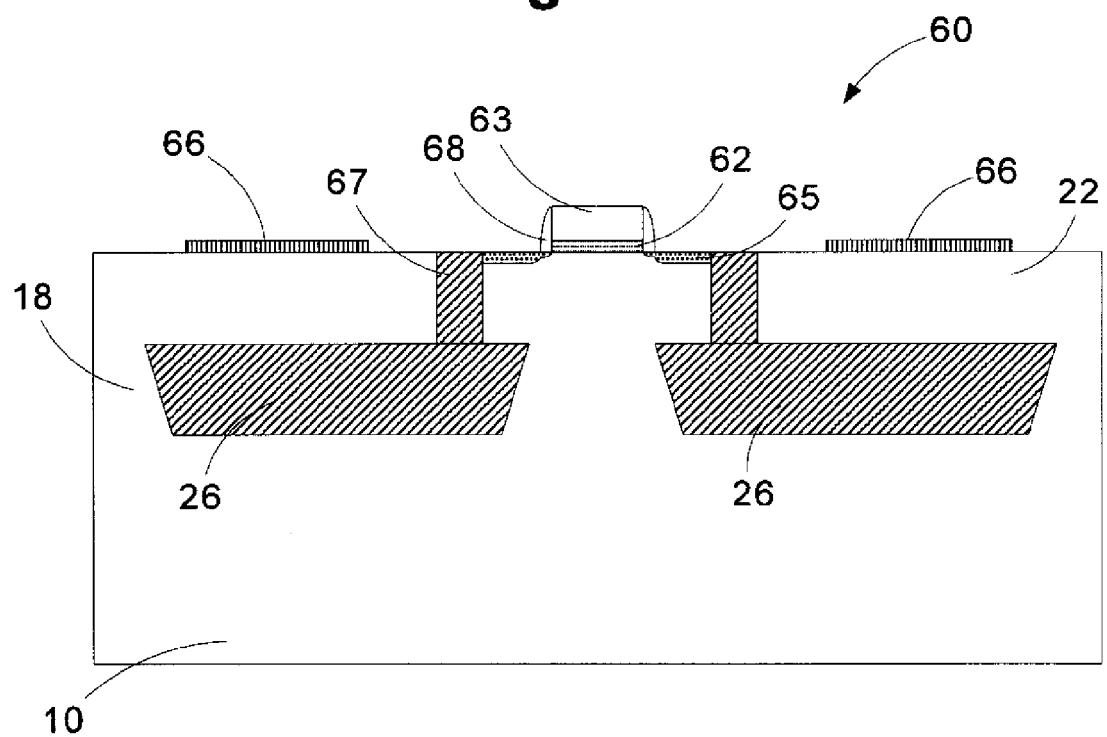
FIG. 5 depicts an illustrative capacitor device formed above the pseudo SOI substrate depicted in FIG. 1C.

FIG. 5 depicts yet another illustrative semiconductor device that may be formed on the pseudo SOI substrate 30. As shown therein, portions of an illustrative capacitor 60 are schematically depicted. The capacitor 60 comprises a control transistor having a gate insulation layer 62, a gate electrode 63, sidewall spacers 68 and source/drain regions 65. A plurality of capacitor contacts 66 formed above the surface of the silicon material 22 are also schematically depicted. An illustrative isolation region 67 is formed in the silicon material 22 to electrically isolate the capacitor 60. Again, the manner in which such devices are formed are well known to those skilled in the art.

Figure 6:
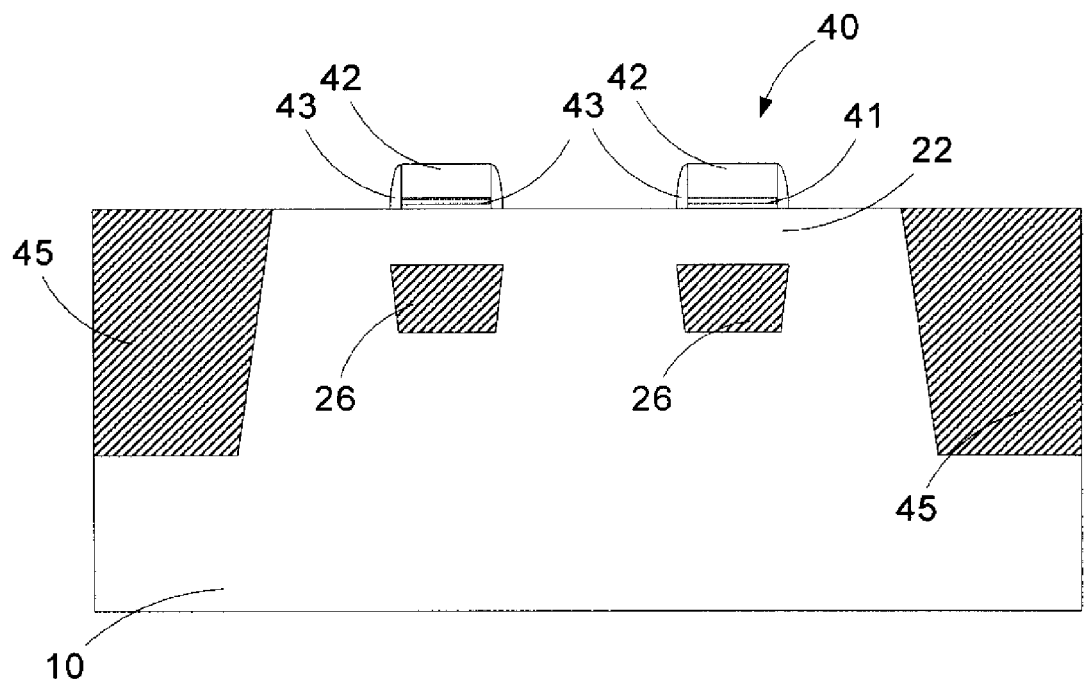
FIG. 6 depicts an illustrative structure wherein the source/drain regions of the illustrative transistors are body tied to the substrate.
Figure 7:
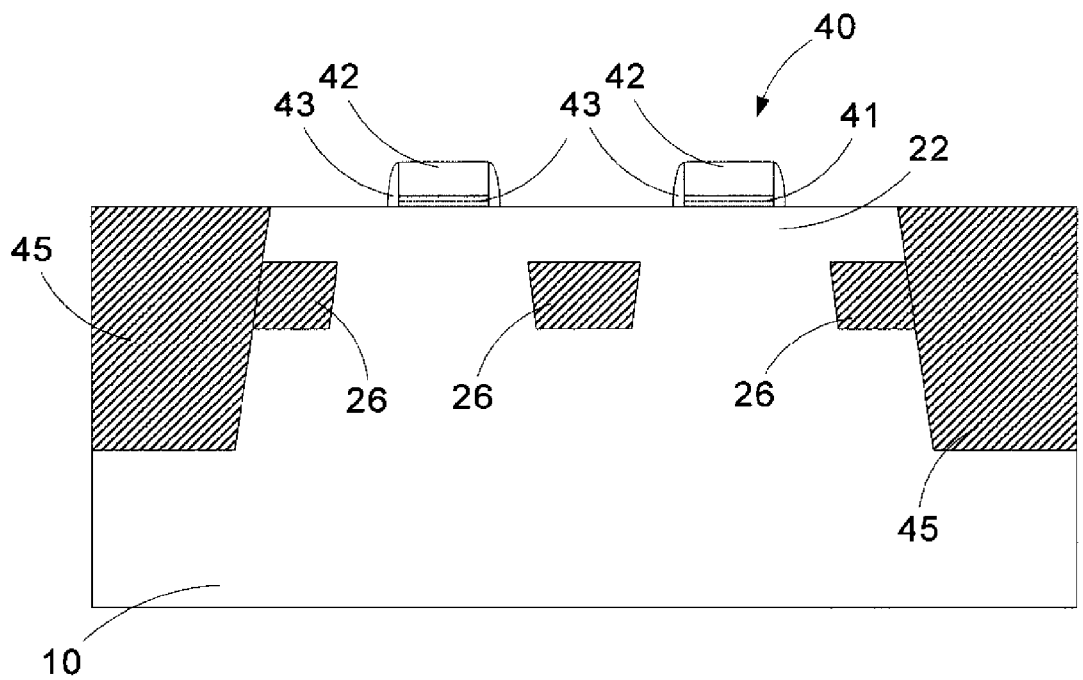
FIG. 7 depicts an illustrative example wherein the gates of the transistors are body tied to the substrate.

FIGS. 6 and 7 also depict illustrative structures wherein the present invention may be employed. FIG. 6 depicts an illustrative example wherein the channel regions of the illustrative transistors 40 are positioned approximately above a region 26 of insulating material. In the embodiment depicted in FIG. 6, those skilled in the art will understand that the source/drain regions (not shown in FIG. 6) are body tied to the substrate 10. FIG. 7 depicts an illustrative structure wherein the channel regions of the illustrative transistors 40 are positioned approximately over the gaps or space between the regions 26. Those skilled in the art will understand that this structure depicts the situation where the gate of the transistor is body tied to the substrate 10.

The present invention is generally directed to a method of forming a pseudo SOI substrate and semiconductor devices. In one illustrative embodiment, the method comprises forming a plurality of trenches in a semiconducting substrate comprised of silicon, each of the trenches having a depth, forming a layer of insulating material within each of the plurality of trenches, the layer of insulating material having a thickness that is less than the depth of the trenches, and performing an anneal process on the substrate in a hydrogen environment to cause the silicon substrate material to merge above the layer of insulating material within the plurality of trenches to thereby define a pseudo SOI substrate.

In another illustrative embodiment, the method comprises forming a plurality of trenches in a semiconducting substrate comprised of silicon, each of the trenches having a depth, forming a layer of insulating material within each of the plurality of trenches, the layer of insulating material having a thickness that is less than the depth of the trenches, and performing an anneal process on the substrate in a hydrogen environment having a partial pressure of 1-200 Torr to cause the silicon substrate material to merge above the layer of insulating material within the plurality of trenches to thereby define a pseudo SOI substrate, wherein the anneal process is performed at a temperature ranging from approximately 800-1200° C.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A device, comprising:
   a substrate comprised of a semiconductor material;
   a plurality of spaced apart dielectric layers respectively comprising an upper surface, a lower surface, and opposing side surfaces; the respective upper, lower and side surfaces being received within and contacting the semiconductor material; the respective spaced apart dielectric layers having an upper surface length between the side surfaces which is greater than lower surface length between the side surfaces; and a plurality of field effect transistors received elevationally outward of the plurality of spaced apart dielectric layers and respectively comprising a gate electrode, a gate dielectric, a channel region, and a pair of source/drain regions; the pair of source/drain regions of each transistor being received directly over at least an individual of the spaced apart dielectric layers.

2. The device of claim 1, wherein each of the plurality of spaced apart dielectric layers is a portion of a deposited layer of dielectric material.

3. The device of claim 1, wherein each of the plurality of spaced apart dielectric layers is a portion of a thermally grown layer of dielectric material.

4. The device of claim 1, wherein the spaced apart dielectric layers are comprised of silicon dioxide, silicon nitride or silicon oxynitride.

5. The device of claim 1, wherein each of the plurality of spaced apart dielectric layers has a substantially trapezoidal configuration.

6. The device of claim 1, wherein the opposing side surfaces of each of the plurality of spaced apart dielectric layers extend from the upper surface to the lower surface along a straight line.

7. A device, comprising:
a substrate comprised of a semiconductor material, the semiconductor material having an uppermost surface;
a plurality of spaced apart dielectric layers respectively comprising an upper surface, a lower surface, and opposing side surfaces; the respective upper, lower and side surfaces being received within and contacting the semiconductor material; the respective spaced apart dielectric layers having an upper surface length between the side surfaces which is greater than lower surface length between the side surfaces;
a plurality of insulative isolation structures received within the semiconductor material, individual of the insulative isolation structures extending upwardly from and in contact with the upper surface of one of the respective spaced apart dielectric layers to the uppermost surface of the semiconductor material, individual of the insulative isolation structures being spaced laterally inward from the respective dielectric layer side surfaces; and
a plurality of field effect transistors respectively comprising a gate electrode, a gate dielectric, a channel region, and a pair of source/drain regions; the channel region of individual of the transistors being received above and between adjacent spaced apart dielectric layers.

8. A device, comprising:
a substrate comprised of a semiconductor material, the semiconductor material having an uppermost surface;
a plurality of spaced apart dielectric layers respectively comprising an upper surface, a lower surface, and opposing side surfaces; the respective upper, lower and side surfaces being received within and contacting the semiconductor material;
a pair of insulative isolation structures received within the semiconductor material, individual of the insulative isolation structures being in contact with only a portion of one of the side surfaces of an individual of the spaced apart dielectric layers and extending upwardly to the uppermost surface of the semiconductor material, the individual isolation structures having a lowest base surface which is received elevationally between the upper and lower surfaces of the individual of the spaced apart dielectric layers; and
a plurality of field effect transistors respectively comprising a gate electrode, a gate dielectric, a channel region, and a pair of source/drain regions received directly over an individual of the spaced apart dielectric layers.

9. The device of claim 8 wherein the respective spaced apart dielectric layers have an upper surface length between the side surfaces which is greater than lower surface length between the side surfaces.

10. The device of claim 1 wherein the pair of source/drain regions of each transistor is received over only one individual of the spaced apart dielectric layers.

11. The device of claim 1 wherein the pair of source/drain regions of each transistor is received over two individual adjacent spaced apart dielectric layers.

12. The device of claim 1 comprising a plurality of insulative isolation structures which individually extend from an upper surface of the semiconductor material inwardly to the upper surface of an individual of the spaced apart dielectric layers.

13. The device of claim 12 wherein each source/drain region contacts one of the insulative isolation structures.

14. The device of claim 12 wherein each insulative isolation structure is rectangular in at least one cross section.

15. The device of claim 1 comprising a plurality of insulative isolation structures individually having a lowest base surface, the insulative isolation structures extending from an upper surface of the semiconductor material inwardly to have the lowest base surfaces received with the semiconductor material elevationally below the upper surface of the individual of the spaced apart dielectric layers.

16. The device of claim 15 wherein each source/drain region contacts one of the insulative isolation structures.

17. The device of claim 15 wherein each insulative isolation structure is rectangular in at least one cross section.

18. The device of claim 7 wherein each source/drain region contacts one of the insulative isolation structures.

19. The device of claim 7 wherein each insulative isolation structure is rectangular in at least one cross section.

20. The device of claim 8 wherein each source/drain region contacts one of the insulative isolation structures.

21. The device of claim 8 wherein each insulative isolation structure is rectangular in at least one cross section.

* * * * *